US008891567B2

(12) United States Patent
Herden et al.

(10) Patent No.: US 8,891,567 B2
(45) Date of Patent: Nov. 18, 2014

(54) HEAT SINK FOR A PULSED HIGH-POWER LASER DIODE

(75) Inventors: Werner Herden, Gerlingen (DE); Hans-Jochen Schwarz, Stuttgart (DE); Wolfgang Pittroff, Woltersdorf (DE)

(73) Assignee: Robert Bosch GmbH, Stuttgart (DE)

( * ) Notice: Subject to any disclaimer, the term of this patent is extended or adjusted under 35 U.S.C. 154(b) by 154 days.

(21) Appl. No.: 13/259,292

(22) PCT Filed: May 18, 2010

(86) PCT No.: PCT/EP2010/056779
§ 371 (c)(1),
(2), (4) Date: Dec. 22, 2011

(87) PCT Pub. No.: WO2010/133572
PCT Pub. Date: Nov. 25, 2010

(65) Prior Publication Data
US 2012/0106582 A1    May 3, 2012

(30) Foreign Application Priority Data

May 22, 2009 (DE) .......................... 10 2009 026 413

(51) Int. Cl.
*H01S 3/04* (2006.01)
*H01L 23/26* (2006.01)
*H01S 5/024* (2006.01)
*H01S 5/022* (2006.01)
*F02P 23/04* (2006.01)
*H01S 3/094* (2006.01)

(52) U.S. Cl.
CPC ............ *H01S 5/02469* (2013.01); *H01L 23/26* (2013.01); *H01S 5/02264* (2013.01); *F02P 23/04* (2013.01); *H01L 2924/01322* (2013.01); *H01S 5/02476* (2013.01); *H01S 5/02272* (2013.01); *H01S 3/094076* (2013.01)
USPC .................................. 372/36; 372/33; 372/34

(58) Field of Classification Search
CPC .. H01S 5/024; H01S 5/02461; H01S 5/02469

USPC ................................................ 372/36, 33, 34
See application file for complete search history.

(56) References Cited

U.S. PATENT DOCUMENTS

| 3,522,552 | A | * | 8/1970 | Willmott ......................... 372/36 |
| 5,978,396 | A | * | 11/1999 | Duchemin et al. .......... 372/43.01 |
| 2003/0152773 | A1 | | 8/2003 | Chrysler et al. |
| 2007/0238219 | A1 | | 10/2007 | Bennett et al. |
| 2009/0104727 | A1 | * | 4/2009 | Krejci et al. .................... 438/46 |

FOREIGN PATENT DOCUMENTS

JP        2001156384        6/2001

OTHER PUBLICATIONS

International Search Report, PCT International Application No. PCT/EP2010/056779, dated Aug. 23, 2010.
S. Weiss et al., "Design, Simulation and Technological Realization of a Reliable Packaging Concept for High Power Laser Bars," *Electronic Components & Technology Conference*, Seattle, WA, USA, May 25, 1998, pp. 1395-1401.

* cited by examiner

*Primary Examiner* — Armando Rodriguez
(74) *Attorney, Agent, or Firm* — Kenyon & Kenyon LLP

(57) ABSTRACT

A semiconductor laser module having a substrate and having at least one semiconductor laser situated on the substrate, the substrate having a layer structure which includes at least one primary layer which establishes a thermal contact with the semiconductor laser. The semiconductor laser is designed in such a way that it emits heat pulses having a minimum specific heat of approximately 3 mJ per mm², preferably approximately 5 mJ/mm², and having a pulse duration of approximately 100 μs to approximately 2,000 μs, and the primary layer has a layer thickness which is between approximately 200 μm and approximately 2,000 μm, preferably between approximately 400 μm and approximately 2,000 μm.

7 Claims, 4 Drawing Sheets

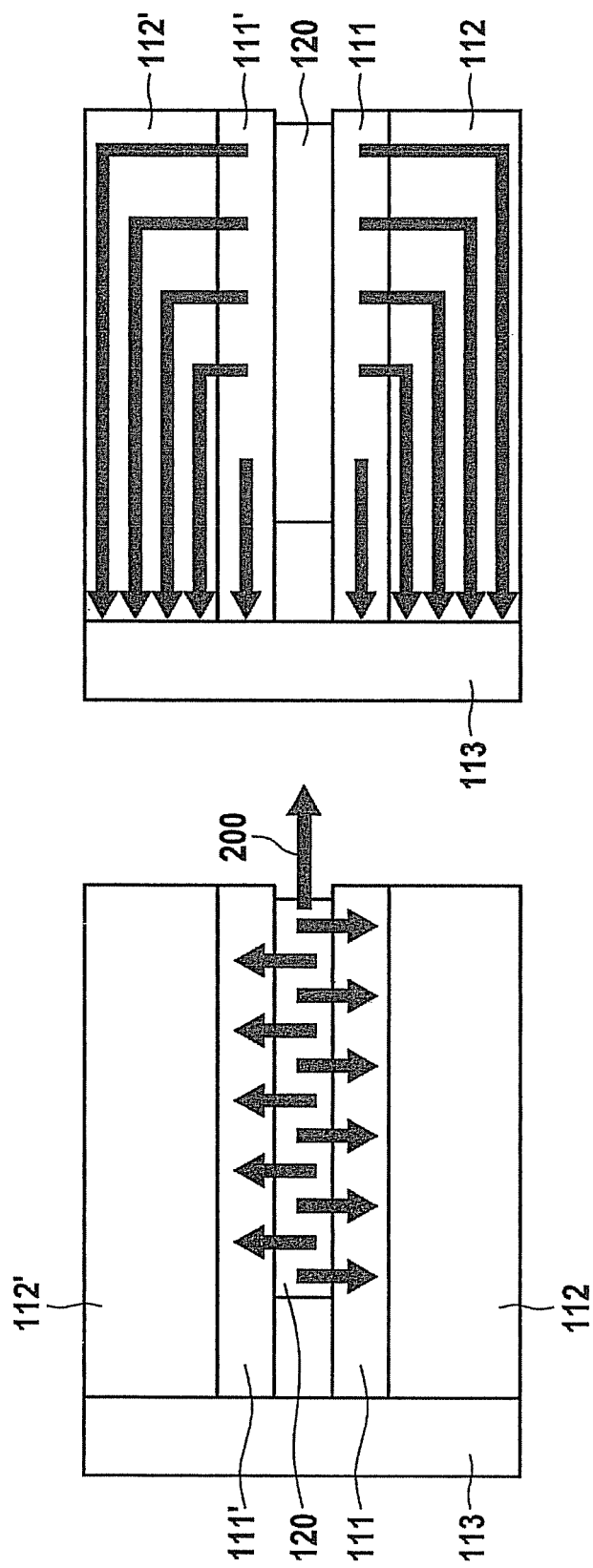

HEAT SINK FOR A PULSED HIGH-POWER LASER DIODE

BACKGROUND INFORMATION

The present invention relates to a semiconductor laser module having a substrate and having at least one semiconductor laser situated on the substrate, the substrate having a layer structure which includes at least one first primary layer which establishes a thermal contact with the semiconductor laser. The present invention also relates to a manufacturing method for a semiconductor laser module of this type.

SUMMARY

An object of the present invention is to improve a semiconductor laser module and a manufacturing method in such a way that effective cooling of the semiconductor laser is provided in pulsed mode with the aid of a cost-effective construction.

According to an example embodiment of the present invention, this object is achieved by providing a semiconductor laser module in which the semiconductor laser is designed in such a way that it emits heat pulses having a minimum specific quantity of heat of approximately 3 millijoules (mJ) per square millimeter ($mm^2$), preferably approximately 5 $mJ/mm^2$, and having a pulse duration of approximately 100 microseconds (µs) to approximately 2,000 µs, and the primary layer has a layer thickness which is between approximately 200 micrometers (µm) and approximately 2,000 µm, preferably between approximately 400 µm and approximately 2,000 µm.

An optimum dissipation of the thermal energy released during pulsed operation of the semiconductor laser takes place if the semiconductor laser and the primary layer provided for the cooling thereof are adapted to each other in this way. Due to the layer thickness of the primary layer selected according to the example embodiment of the present invention, it is ensured, in particular, that at least an overwhelming portion of a heat pulse emitted by the semiconductor laser may be absorbed by the primary layer, so that efficient and simultaneously cost-effective cooling of the semiconductor laser is possible during pulsed operation thereof. In contrast to conventional systems, in particular, the example embodiment of the present invention does not require any layer thicknesses for the primary layer which are substantially more than two millimeters, enabling the semiconductor laser module according to the present invention to be manufactured cost-effectively.

In a preferred specific embodiment of the semiconductor laser module according to the present invention, the pulse frequency of the heat pulses is less than approximately 400 Hertz (Hz), preferably less than approximately 100 Hz, so that the heat "temporarily stored" in the primary layer may be dissipated to a cooling member in the pulse pauses. The primary layer is advantageously cooled thereby and it is subsequently ready again to quickly absorb a heat pulse generated by the semiconductor laser.

Pulse durations and pulse pauses of the aforementioned magnitude occur, in particular, when using the semiconductor laser for optically pumping up other laser systems, specifically passive Q-switched laser systems, which are used, for example, to generate laser ignition pulses in laser spark plugs of internal combustion engines. The semiconductor laser module according to the present invention is therefore particularly suitable as a pump light source for laser-based ignition systems in internal combustion engines, in particular in motor vehicles or also stationary large gas engines.

According to an advantageous specific embodiment of the present invention, an even further improved dissipation of the heat pulses generated by the semiconductor laser is obtained if a second primary layer is provided which is in thermal contact with the semiconductor laser, in particular with a surface of the semiconductor layer which faces away from the first primary layer.

To reduce thermomechanical stresses during operation of the semiconductor laser, it may be provided according to another advantageous specific embodiment that the primary layer and a secondary layer of the substrate connected to the primary layer are designed, in particular adapted to each other, in such a way that a resulting coefficient of thermal expansion of the two layers in the area of a surface facing the semiconductor layer approximately coincides with the coefficient of thermal expansion of the semiconductor layer. In a particularly preferred manner, the relevant coefficients of thermal expansion deviate from each other by a maximum of approximately 20 percent, preferably by approximately 10 percent.

In a particularly preferred manner, the primary layer includes copper and/or gold and/or silver and/or other materials which have a comparable thermal capacity and a comparable thermal conductivity. Ductile materials are preferably used to form the primary layer to enable efficient microstructuring of the surface facing the semiconductor laser, with the goal of enabling plastically deformable microstructures to be produced on the surface which achieve an improved form-locked fit and thus also a lower thermal resistance when the components are joined together.

An example method according to the present invention for manufacturing a semiconductor laser module having a substrate and having at least one semiconductor laser situated on the substrate, the substrate having a layer structure which includes at least one primary layer which establishes a thermal contact with the semiconductor laser, is characterized by the following steps:

producing a primary layer having a layer thickness which is between approximately 200 µm and approximately 2,000 µm, preferably between approximately 400 µm and approximately 2,000 µm;

connecting the semiconductor laser to the primary layer.

To guarantee a form-locked transition between an epitaxial side of the semiconductor laser and the primary layer in a manner which preferably minimizes thermal resistance, it is proposed in another variant of the method according to the present invention that the step of connecting the semiconductor laser to the primary layer is carried out by:

hard-soldering or soft-soldering using a solder layer thickness which is less than approximately 40 µm, preferably approximately 10 µm;

alloying the components together using a liquid metal layer, in particular a gallium-indium-tin-eutectic system;

friction welding;

bonding with the aid of ultrasound;

thermal bonding;

clamping, in particular by inserting a liquid metal layer, in particular a gallium-indium-tin-eutectic system, between the components.

In another advantageous specific embodiment of the method according to the present invention, it is provided that, prior to the connecting step, at least one surface of the two components to be connected is subjected to microstructuring, which produces regular and/or statistically distributed, preferably plastically deformable microstructures on the surface. This makes it advantageously possible to achieve a tolerance compensation with regard to the form-locked fit between the surfaces to be joined, because the plastically deformable microstructures are plastically deformed when the semiconductor laser is connected to the primary layer, whereby irregularities on the surfaces involved may be compensated. This results in an optimized form-locked fit and thus lower thermal resistance in the connection between the semiconductor laser and the primary layer.

A further improved connection between the semiconductor laser and the primary layer is achieved according to the present invention in that the surfaces to be joined together are coated with a gold layer or a gold-nickel layer. As an alternative to microstructuring the primary layer or the semiconductor laser itself, the surfaces thereof may also be covered by a suitable microstructurable material, for example a gold layer, and the microstructure according to the present invention is produced in the gold layer, for example with the aid of electronic erosion using pulsed current.

Further features, applications and advantages of the present invention are derived from the description below of exemplary embodiments of the present invention, which are illustrated in the figures. All features described or illustrated by themselves or in any combination represent the object of the present invention, regardless of their combination or their wording in the description or illustration in the figures.

BRIEF DESCRIPTION OF THE DRAWINGS

FIGS. 3a, 3b show another specific embodiment of the semiconductor laser module according to the present invention in different operating modes.

DETAILED DESCRIPTION OF EXAMPLE EMBODIMENTS

Figure 1B:
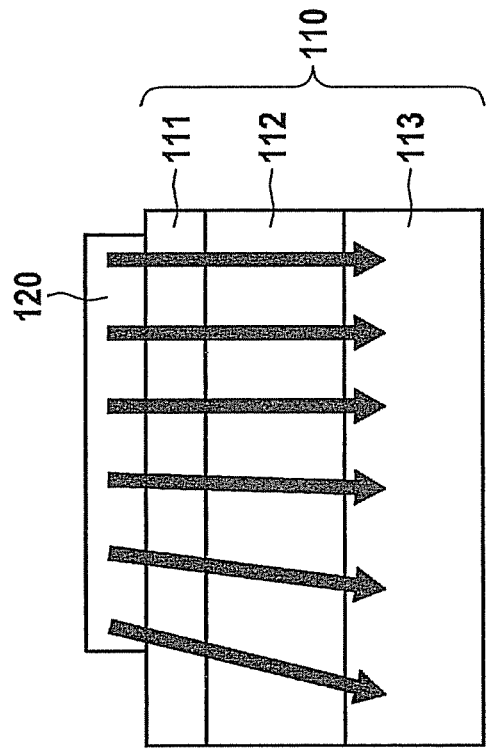
FIG. 1b shows the semiconductor laser module according to FIG. 1a having a deactivated semiconductor laser.
Figure 1A:
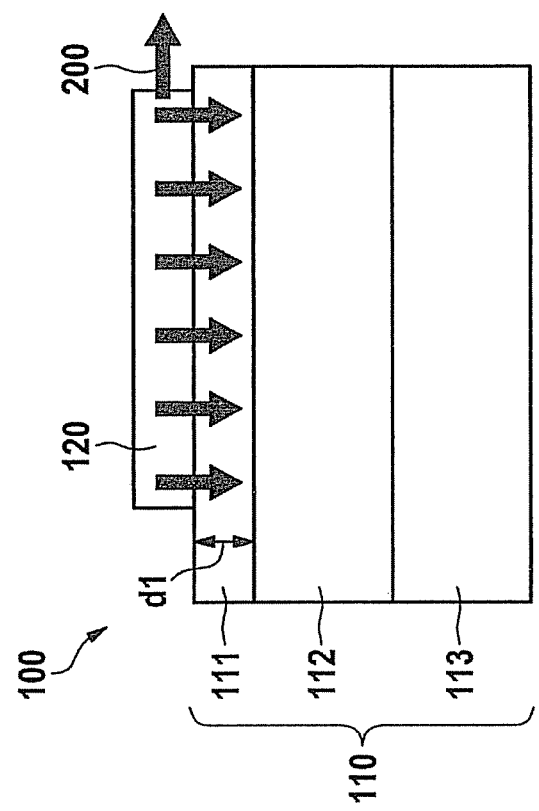
FIG. 1a shows a first specific embodiment of the semiconductor laser module according to the present invention during an active phase of pulsed operation of the semiconductor laser.

FIG. 1a shows a schematic side view of a first specific embodiment of semiconductor module 100 according to the present invention in a first operating state. Semiconductor laser module 100 has a semiconductor laser 120 which is connected to a substrate 110. In the first operating state, preferably in a pulsed mode, semiconductor laser 120 generates laser radiation 200, which among other things may be used to optically pump additional laser systems (not illustrated).

In addition to mechanical holding of semiconductor laser 120, substrate 110 is used primarily for temperature control, in particular cooling, of semiconductor laser 120.

For this purpose, substrate 110 has a primary layer 111 which accommodates semiconductor laser 120 and which is in good thermal contact with semiconductor laser 120. Primary layer 111 is connected to a secondary layer 112 on its side facing away from semiconductor laser 120. Secondary layer 112, in turn, is situated on a heat sink 113, which is designed, for example, as a cooling member and/or as a Peltier element and/or as a heat pipe.

Primary layer 111 is preferably made of silver and/or gold and/or copper, while secondary layer 112 is preferably made of a ceramic material, such as aluminum nitride (AlN), or it includes material systems made of copper and diamond.

Semiconductor laser 120 is optimized for use in pulsed mode, in particular it is optimized for a pulsed mode required for optical pumping of additional laser systems (not illustrated). For example, semiconductor laser 120 may emit pump light pulses 200 which are used to optically pump laser systems having a passive Q-switch. Systems of this type are preferably suitable for use in laser-based ignition systems of internal combustion engines, for example in motor vehicles.

According to an example embodiment of the present invention, semiconductor laser 120 is designed in such a way that it emits heat pulses having a minimum specific quantity of heat of approximately 3 mJ per $mm^2$, preferably approximately 5 mJ per $mm^2$, the pulse duration being approximately 100 µs to approximately 2,000 µs.

According to the example embodiment of the present invention, a thickness d1 of primary layer 111 is selected to be approximately 200 µm to approximately 2,000 µm, preferably between approximately 400 µm and approximately 2,000 µm.

An optimized dissipation of the heat pulses generated by semiconductor laser 120 during pulsed operation thereof to primary layer 111 occurs in the configuration according to the present invention described above; see the arrows in FIG. 1a, which are not identified in further detail. In selecting layer thickness d1 according to the present invention, it is advantageously ensured, in particular, that primary layer 111 is able to absorb a complete heat pulse emitted by semiconductor laser 120 before the heat pulse reaches secondary layer 112 situated thereunder in FIG. 1a. Thus, primary layer 111 according to the present invention likewise functions as a local temporary storage element for the heat pulses to be discharged from semiconductor laser 120.

In the comparatively long pulse pauses which result from a preferred pulse frequency of the heat pulses, which is less than approximately 400 Hz, preferably less than approximately 100 Hz, it is ensured that the heat from primary layer 111 may be discharged to heat sink 113 via secondary layer 112. This operating state is illustrated in FIG. 1b; see the arrows, which are not identified in further detail and which indicate the heat transfer from primary layer 111 to cooling member 113 during a pulse pause.

In comparison to conventional semiconductor laser modules, which are usually designed for continuous wave (cw) applications, semiconductor laser module 100 according to the present invention has a particularly cost-effective design, since the principle according to the present invention provides temporary storage of the heat pulses generated by semiconductor laser 120 in primary layer 111, combined with a subsequent heat dissipation 111 to heat sink 113 via secondary layer 112, which takes place during a pulse pause.

This means that semiconductor laser module 100 according to the present invention is able to operate at relatively high pulse power without simultaneously requiring substantially more complex cooling via a corresponding design of substrate 110, as is the case with conventional systems.

This enables economical manufacture of semiconductor laser module 100 according to the present invention. In particular, a material may be selected for secondary layer 112 which has a lower thermal conductivity than the material of primary layer 111 because the relatively long pulse pauses are used for conducting heat through secondary layer 112.

Figure 2B:
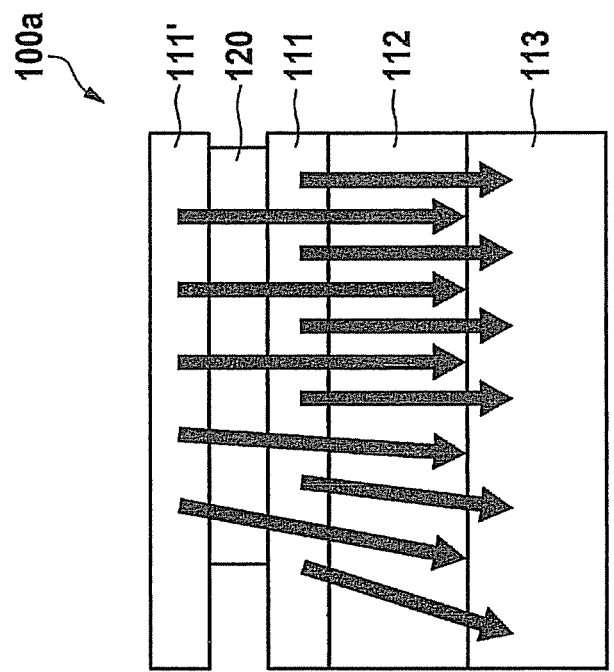
FIGS. 2a, 2b show another specific embodiment of the semiconductor laser module according to the present invention in different operating modes.
Figure 2A:
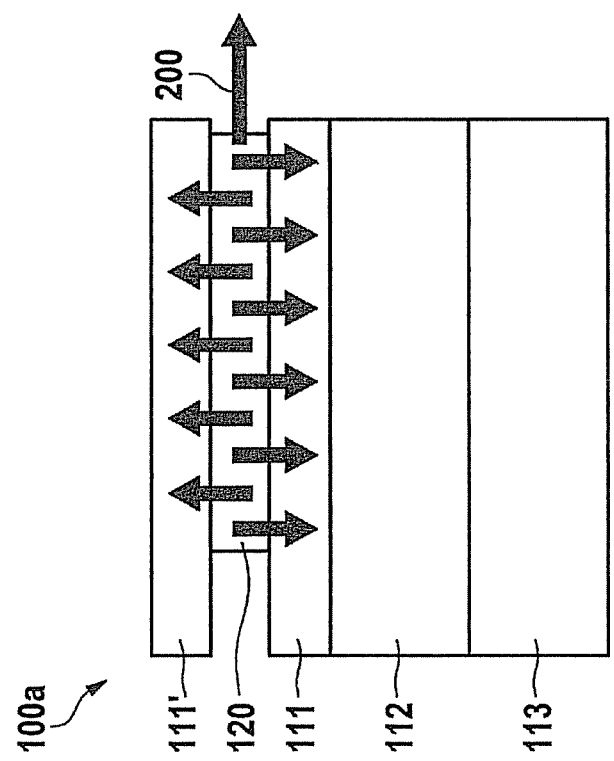

Another specific embodiment 100a of the semiconductor laser module according to the present invention is illustrated in FIGS. 2a, 2b. Semiconductor laser module 100a has two primary layers 111, 111', which increases the heat storage capacity of primary layers 111, 111', compared to the specific embodiment according to FIGS. 1a, 1b. This variant of the present invention enables semiconductor laser 120 to operate at a higher pulse power.

FIG. 2a, in turn, illustrates a first operating state of semiconductor laser module 100a, which has an active semiconductor laser 120 which emits laser pulse 200. The heat pulse produced hereby is illustrated by the arrows pointing from semiconductor laser 120 to primary layers 111, 111'.

FIG. 2b shows another operating state of semiconductor laser module 100a according to an example embodiment of the present invention, corresponding to a pulse pause, in which semiconductor laser 120 is deactivated and the heat previously input (FIG. 2a) into primary layers 111, 111' is removed via semiconductor laser 120, secondary layer 112 and heat sink 113.

FIGS. 3a, 3b show another specific embodiment of the semiconductor laser module according to the present invention, in which a combination of a primary layer 111, 111' and a secondary layer 112, 112' assigned thereto is provided on both sides of semiconductor laser 120.

In the present exemplary embodiment, heat sink 113 is situated on the end faces of substrate layers 111, 112, 111', 112' located on the left in FIG. 3a.

FIG. 3a, in turn, specifies an operating state in which a heat pulse generated by semiconductor laser 120 is stored in primary layers 111, 111', while FIG. 3b illustrates the dissipation of the previously stored heat pulse from primary layers 111, 111' to heat sink 113 via secondary layers 112, 112'.

Figure 4:
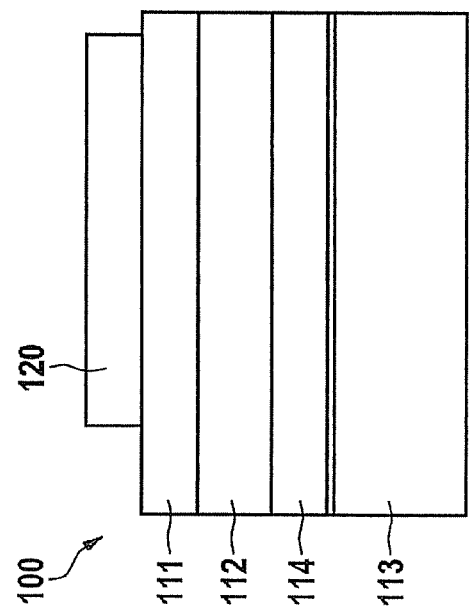
FIG. 4 shows even another specific embodiment of the semiconductor laser module according to the present invention.

FIG. 4 shows another particularly advantageous specific embodiment of semiconductor laser module 100 according to the present invention in which primary layer 111 and secondary layer 112 are part of a direct copper bonded (DCB) substrate, whose primary layer 111 is made of copper and which has a layer thickness of approximately 400 µm, and whose secondary layer 112 is made of aluminum nitride (AlN), which in the present case has a thickness of approximately 630 µm.

To achieve an optimized adaptation of the substrate which accommodates semiconductor laser 120, an additional layer 114 is assigned to layer structure 111, 112, so that a symmetrical configuration 111, 112, 114 of materials in relation to secondary layer 112 results with regard to its coefficient of thermal expansion. The coefficient of thermal expansion resulting from layer structure 111, 112, 114 in the area of the contact surface with semiconductor laser 120 is preferably adapted to the coefficient of thermal expansion of semiconductor laser 120 to avoid damage to semiconductor laser 120 due to thermomechanical stresses which occur during heating.

Instead of the substrate variant having a DCB substrate illustrated in FIG. 4, a DC40 substrate may also be used which has a layer structure 111, 112, 114 which includes a copper layer 111, a DC40 (copper-diamond) layer 112 and a copper layer 114.

This has the advantage over the DCB substrate variant that secondary layer 112, which includes the DC40 material, enables a better heat spread than a layer which includes aluminum nitride, due to its higher thermal conductivity. Copper layers 111, 114 may be preferably bonded onto DC40 material 112, for example with the aid of thermocompression bonding, or they may be soldered. DC40 layer 112 may have a layer thickness of, for example, approximately 400 µm.

Figure 5:
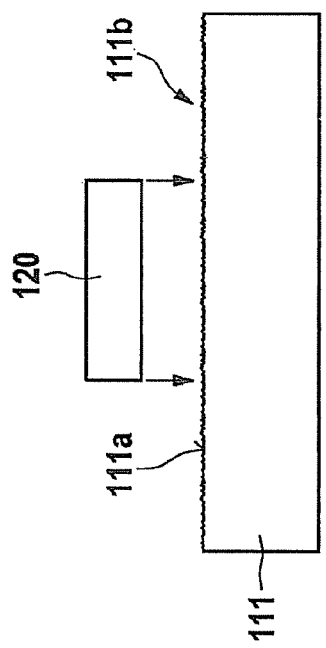
FIG. 5 shows a schematic side view of a specific embodiment of the semiconductor laser module according to the present invention before the semiconductor laser is connected to the primary layer accommodating it.

FIG. 5 shows a schematic side view of a semiconductor laser module according to the present invention before semiconductor laser 120 is connected to primary layer 111 accommodating it.

As is apparent from FIG. 5, primary layer 111 has microstructuring 111b on its surface 111a facing semiconductor laser 120, this microstructuring including, for example, regular or statistically distributed microstructures in the form of trenches and/or turrets and/or sponge-like structures. Microstructuring 111b preferably includes plastically deformable microstructures which are plastically deformed during connection of semiconductor laser 120 to primary layer 111 and thereby ensure an optimized form-locked fit between the contact surfaces of components 111, 120, which advantageously also reduces the thermal resistance of this connection.

In a preferred variant of the present invention, microstructures 111b include elements, for example turrets, whose largest dimension perpendicular to surface 111a is in the range of approximately 5 µm to approximately 100 µm. The diameter of the turrets is preferably less than approximately 10 µm, in particular less than approximately 2 µm, and an average distance between adjacent turrets should be less than approximately 4 µm, preferably approximately 0.5 µm.

Figure 6:
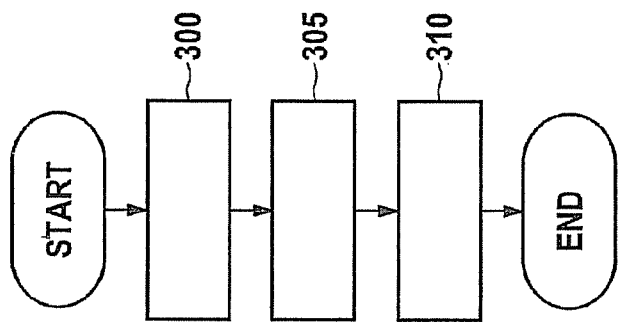
FIG. 6 shows a simplified flow chart of a specific embodiment of the method according to the present invention.

FIG. 6 shows a simplified flow chart of a specific embodiment of the method according to the present invention. In a first step 300, primary layer 111 according to the present invention is produced having a layer thickness d1 (FIG. 1a) of approximately 200 µm to approximately 2,000 µm, preferably approximately 400 µm to approximately 2,000 µm.

In a subsequent step 305, microstructuring 111b already described above with reference to FIG. 5 is applied to at least one of surfaces 111a of connection partners 111, 120.

Semiconductor laser 120 and primary layer 111 are then connected to each other, which takes place in step 310 and which may be carried out, for example, by clamping components 111, 120. For this purpose, a sufficiently high pressure is applied to deform plastically deformable microstructures 111b, so that any surface errors of connection partners 111, 120 are compensated if necessary.

In particular, connecting 310 semiconductor laser 120 to primary layer 111, 111' may preferably be carried out by:
hard-soldering or soft-soldering using a solder layer thickness which is less than approximately 40 µm, preferably approximately 10 µm;
alloying components 111, 111', 120 together using a liquid metal layer, in particular a gallium-indium-tin-eutectic system;
friction welding;
bonding with the aid of ultrasound;
thermal bonding;
clamping, in particular by inserting a liquid metal layer, in particular a gallium-indium-tin-eutectic system, between components 111, 111', 120.

Components 111, 111', 120 are preferably alloyed at temperatures of less than or equal to approximately 150° C.

A further improved connection between semiconductor laser 120 and primary layer 111 is established if surface 111a (FIG. 5) of primary layer 111 is coated with a gold layer or a gold-nickel layer or the like.

In addition to microstructuring 305 of surface 111a (FIG. 5) of primary layer 111, as described above, a conventional surface treatment may also be carried out with the goal of minimizing the surface roughness, for example with the aid of diamond milling or the like. The measures according to the present invention described above for connecting the surfaces or for reducing the particular thermal resistances may also be applied to layers 111, 112, 113 among each other or they may be combined with each other.

What is claimed is:

1. A semiconductor laser module, comprising:
   a substrate; and
   at least one semiconductor laser situated on the substrate, the substrate having a layer structure which includes at least one first primary layer which establishes a thermal contact to the semiconductor laser, wherein the semiconductor laser is designed so that it emits heat pulses having a minimum specific quantity of heat of approximately 3 mJ per mm$^2$, and having a pulse duration of approximately 100 µs to approximately 2,000 µs, and the first primary layer has a layer thickness which is between approximately 400 µm and approximately 2,000 µm,
   wherein the layer structure includes a second primary layer which is in thermal contact with the semiconductor laser via a surface of the semiconductor laser which faces away from the first primary layer and is not in contact with the first primary layer.

2. The semiconductor laser module as recited in claim 1, wherein the minimum specific quantity of heat is approximately 5 mJ per mm$^2$.

3. The semiconductor laser module as recited in claim 1, wherein a pulse frequency of the heat pulses is less than approximately 400 Hz.

4. The semiconductor laser module as recited in claim 3, wherein the pulse frequency is less than approximately 100 Hz.

5. The semiconductor laser module as recited in claim 1, wherein the layer structure includes a secondary layer situated on a surface of the first primary layer which faces away from the semiconductor laser and which is thermally connected to the first primary layer.

6. The semiconductor laser module as recited in claim 5, wherein the first primary layer and the secondary layer are designed in such a way that a resulting coefficient of thermal expansion of the first primary layer and the secondary layer in the area of a surface facing the semiconductor laser approximately coincides with a coefficient of thermal expansion of the semiconductor laser.

7. The semiconductor laser module as recited in claim 1, wherein the first primary layer includes at least one of copper, gold, and silver.

* * * * *